United States Patent
Wu (10) Patent No.: US 8,433,969 B1
(45) Date of Patent: Apr. 30, 2013

(54) FORWARD ERROR CORRECTION (FEC) AUTO NEGOTIATION FOR AN OPTICAL TRANSPORT NETWORK (OTN)

(75) Inventor: Chaoping Wu, San Ramon, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 281 days.

(21) Appl. No.: 12/949,568

(22) Filed: Nov. 18, 2010

(51) Int. Cl.
*H03M 13/00* (2006.01)
*H04L 1/18* (2006.01)

(52) U.S. Cl.
USPC .......................................... 714/751; 714/748

(58) Field of Classification Search .................. 714/748, 714/752, 774, 751
See application file for complete search history.

(56) References Cited

U.S. PATENT DOCUMENTS

| | | | | |
|---|---|---|---|---|
| 6,553,534 B2 * | 4/2003 | Yonge et al. | ................... | 714/774 |
| 6,697,984 B1 * | 2/2004 | Sim et al. | ....................... | 714/751 |
| 7,058,086 B2 * | 6/2006 | Marko | ............................ | 370/477 |
| 7,145,964 B2 * | 12/2006 | Hoffmann et al. | ............ | 375/298 |
| 7,213,197 B2 * | 5/2007 | Jacobsen et al. | ............... | 714/800 |
| 7,904,779 B2 * | 3/2011 | Belogolovy et al. | .......... | 714/751 |
| 7,975,189 B2 * | 7/2011 | Kose | .............................. | 714/704 |
| 8,122,330 B2 * | 2/2012 | De Lind Van Wijngaarden et al. | .............................. | 714/787 |
| 2005/0149822 A1 | 7/2005 | Lee et al. | | |
| 2008/0010661 A1 | 1/2008 | Kappler et al. | | |
| 2008/0065960 A1 | 3/2008 | Cheng et al. | | |
| 2008/0260378 A1 | 10/2008 | Khermosh | | |
| 2009/0129777 A1 | 5/2009 | Singh | | |
| 2009/0169218 A1 | 7/2009 | Nonaka et al. | | |
| 2009/0202239 A1 | 8/2009 | Holness et al. | | |

* cited by examiner

*Primary Examiner* — James C Kerveros (57) ABSTRACT

In an Optical Transport Network communication device using a plurality of forward error correction (FEC) algorithms, a method is provided for auto negotiating an FEC algorithm between network-connected devices. The first device sends an FEC auto negotiation (AN) request message to a second device. If the first device receives the FEC AN response from the second device, the first device selects the FEC algorithm suggested in the FEC AN response. In the event that the first device is unable to negotiate a mutually agreed upon FEC algorithm with the second device, the first device enters a trial-and-error mode, beginning with a first FEC algorithm. The first device iteratively cycles through each of the plurality of n FEC algorithms, and measures error statistics associated with the nth FEC algorithms. The first device compares the n sets of error statistics and selects an FEC algorithm associated with the minimum number of errors.

24 Claims, 4 Drawing Sheets

FORWARD ERROR CORRECTION (FEC) AUTO NEGOTIATION FOR AN OPTICAL TRANSPORT NETWORK (OTN)

BACKGROUND OF THE INVENTION

1. Field of the Invention

This invention generally relates to communication systems and, more particularly, to a system and method for negotiating a forward error correction (FEC) algorithm where at least one link partner is optionally capable of transceiving messages with more than one FEC algorithm.

2. Description of the Related Art

As noted in Wikipedia, forward error correction (FEC) or channel coding is a system of error control for data transmission, whereby the sender adds systematically generated redundant data to its messages, also known as an error-correcting code. A carefully designed redundancy permits the receiver to detect and correct a limited number of errors occurring anywhere in the message without the need to ask the sender for additional data. FEC gives the receiver an ability to correct errors without needing a reverse channel to request retransmission of data, but this advantage is at the cost of a fixed higher forward channel bandwidth. FEC is therefore applied in situations where retransmissions are relatively costly, or impossible such as when broadcasting to multiple receivers.

FEC processing in a receiver may be applied to a digital bit stream or in the demodulation of a digitally modulated carrier. For the latter, FEC is an integral part of the initial analog-to-digital conversion in the receiver. The Viterbi decoder implements a soft-decision algorithm to demodulate digital data from an analog signal corrupted by noise. Many FEC coders can also generate a bit-error rate (BER) signal which can be used as feedback to fine-tune the analog receiving electronics. The maximum fractions of errors or of missing bits that can be corrected is determined by the design of the FEC code, so different forward error correcting codes are suitable for different conditions.

The two main categories of FEC codes are block codes and convolutional codes. Block codes work on fixed-size blocks (packets) of bits or symbols of predetermined size. Practical block codes can generally be decoded in polynomial time to their block length. Convolutional codes work on bit or symbol streams of arbitrary length. They are most often decoded with the Viterbi algorithm, though other algorithms are sometimes used. Viterbi decoding allows asymptotically optimal decoding efficiency with increasing constraint length of the convolutional code, but at the expense of exponentially increasing complexity. A convolutional code can be turned into a block code, if desired, by "tail-biting".

There are many types of block codes, but among the classical ones the most notable is Reed-Solomon coding because of its widespread use on the Compact disc, the DVD, and in hard disk drives. Golay, BCH, Multidimensional parity, and Hamming codes are other examples of classical block codes. FEC codes may be concatenated for improved performance.

The following is a list of well known FEC codes:
BCH code;
Constant-weight code;
Convolutional code;
Group codes;
Golay codes; especially binary Golay;
Goppa code;
Hadamard code;
Hagelbarger code;
Hamming code;
Latin square based code for non-white noise;
Lexicographic code;
Long code;
Low-density parity-check code, also known as Gallager code;
LT code;
m of n codes;
Online code;
Raptor code;
Reed-Solomon code;
Reed-Muller code;
Repeat-accumulate code;
Repetition codes, such as Triple modular redundancy;
Tornado code;
Turbo code; and,
Walsh-Hadamard code.

Many other related codes are proprietary to vendors. Thus, communicating devices, if made by different vendors for example, may not necessarily be able to communicate using a common FEC algorithm. As described in US 2008/0065960, a reserved field in an OTU2 frame header can be used by a transmitter to alert a receiver of the type of FEC algorithm being used by the transmitter. However, this method does not provide a means for the transmitter and receiver to negotiate on the subject of a common FEC algorithm. U.S. Pat. No. 7,555,214 describes a mechanism for turning an FEC algorithm on or off. However, no means is described for negotiating between a transmitter and receiver, to select a mutually beneficial FEC algorithm.

It would be advantageous if a streamlined process of auto-negotiation were developed that could account for devices capable of using multiple types of FEC algorithms.

SUMMARY OF THE INVENTION

Disclosed herein are a system and method that permits Optical Transport Network (OTN) equipment to negotiate a mutually beneficial forward error correction (FEC) type automatically. This negotiation process can be enabled, for example using host software. This is a mechanism that permits OTN equipment from different vendors, or from the same vendor with multiple FEC capability, to interoperate automatically. The mechanism is reliable in that actual bit errors are taken into account. The mechanism is flexible in that it permits the selection of a preferred FEC type. Either in-band or out-band data streams can be used as the carrier to communicate the required information. The mechanism is automated, as there is no need for human operators to manually set one of the available FEC types in local and remote OTN equipment.

Accordingly, in an OTN communication device using a plurality of FEC algorithms, a method is provided for auto negotiating an FEC algorithm between network-connected devices. A first communication device is network-connected to a second device, where the first device is capable of enabling a plurality of n FEC algorithms. In the event that the first device is unable to negotiate a mutually agreed upon FEC algorithm with the second device, the first device enters a trial-and-error mode, beginning with a first FEC algorithm. The first device iteratively cycles through each of the plurality of n FEC algorithms, and measures error statistics associated with the nth FEC algorithms. The first device compares the n sets of error statistics and selects an FEC algorithm associated with the minimum number of errors.

In one aspect, an FEC algorithm is selected for receiving messages from the second device. In another aspect, an FEC algorithm is selected for transmitting messages to the second device. The transmission FEC algorithm can be the same FEC algorithm selected for received messages or a default FEC algorithm.

Prior to the first device entering the trial-and-error mode, the first device sends an FEC auto negotiation (AN) request message to the second device. The first device only enters the trial-and-error mode if the first device fails to receive an FEC AN response from the second device, or if the second device does not agree to the use of an FEC algorithm suggested by the first device. However, if the first device receives the FEC AN response from the second device, the first device selects the FEC algorithm suggested in the FEC AN response.

Additional details of the above-described method, and a system for auto negotiating an FEC algorithm between network-connected devices, are provided below.

DETAILED DESCRIPTION

Figure 1:
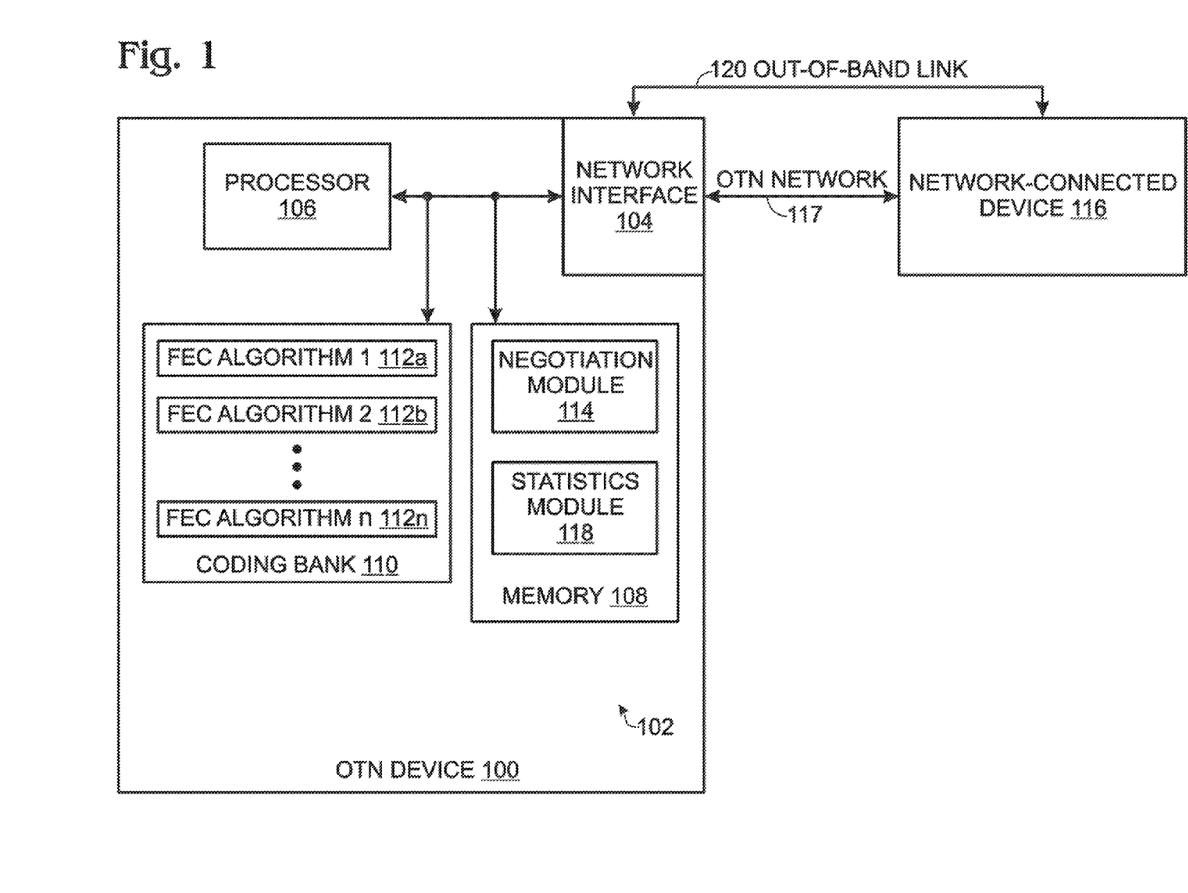
FIG. 1 is a schematic block diagram of an Optical Transport Network (OTN) communication device using a plurality of forward error correction (FEC) algorithms, with a system for auto negotiating an FEC algorithm between network-connected devices.

FIG. 1 is a schematic block diagram of an Optical Transport Network (OTN) communication device 100 using a plurality of forward error correction (FEC) algorithms, with a system for auto negotiating an FEC algorithm between network-connected devices. The system 102 comprises a network interface 104, a processor 106, and a local tangible memory 108.

As used in this application, the terms "component," "module," "system," and the like may be intended to refer to an automated computing system entity, such as hardware, firmware, a combination of hardware and software, software, software stored on a computer-readable medium, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

The computer devices described below typically employ a computer system with a bus or other communication mechanism for communicating information, and a processor coupled to the bus for processing information. The computer system may also includes a main memory, such as a random access memory (RAM) or other dynamic storage device, coupled to the bus for storing information and instructions to be executed by processor. These memories may also be referred to as a computer-readable medium or tangible memory. The execution of the sequences of instructions contained in a computer-readable medium may cause a processor to perform some of the steps associated with position calculation. Alternately, these functions, or some of these functions may be performed in hardware. The practical implementation of such a computer system would be well known to one with skill in the art.

As used herein, the term "computer-readable medium" refers to any medium that participates in providing instructions to a processor for execution. Such a medium may take many forms, including but not limited to, non-volatile media, volatile media, and transmission media. Non-volatile media includes, for example, optical or magnetic disks. Volatile media includes dynamic memory. Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

A coding bank 110 includes a plurality of n selectable FEC algorithm modules 112. Typically, the FEC algorithm modules 112 are enabled in hardware, e.g., as a sequence of interconnected shift register, in the interest of processing speed, but the modules could potentially be enabled in software. A negotiation module 114 is typically enabled as a sequence of software instructions stored in the memory 108 and executed by the processor 106. The negotiation module 114 iteratively cycles through each of the plurality of n FEC algorithm modules 112 from the coding bank 110 in the event that it is unable to negotiate a mutually agreed upon FEC algorithm with a network-connected device 116, connected via the OTN network on line 117.

A statistics module 118 is typically enabled as a sequence of software instructions stored in the memory 108 and executed by the processor 106. The statistics module measures error statistics associated with the n FEC algorithms and compares the n sets of error statistics. The negotiation module 114 selects an FEC algorithm associated with the minimum number of errors. In one aspect, the statistics are available in a PHY chip (i.e. the network interface) and are retrieved and monitored by the statistics module. Although not explicitly shown, the FEC algorithms may also be implemented in the PHY after selection by the negotiation module.

In one aspect, the negotiation module 114 selects the FEC algorithm to receive messages from the network-connected device, with non-predetermined data and FEC sections encoded using the first FEC algorithm. Alternately, the received message may be a test pattern with predetermined data and an FEC section encoded using the first FEC algorithm. In another aspect, the negotiation module 114 selects an algorithm for transmitting messages to the network-connected device, with non-predetermined (or predetermined) data and FEC sections encoded using the selected FEC algorithm. The negotiation module uses either the FEC algorithm selected for received messages, or a default FEC algorithm.

Prior to the negotiation module 114 entering the trial-and-error mode, it sends an FEC auto negotiation (AN) request message to the network-connected device 116. The negotiation module 114 may enter the trial-and-error mode as a result of failing to receive an FEC AN response from the network-connected device. For example, the negotiation module 114 may send the FEC AN request message with a time-out field, and fail to receive an FEC AN response from the network-connected device 116 within the period of time specified in the time-out field. Alternatively, the negotiation module 114 may enter the trial-and-error mode if the network-connected device responds, but fails to agree to the use of an FEC algorithm suggested in the AN request message.

In one aspect, the device 100 can cycle through one of its own FEC algorithms if AN fails, in order to select a proper FEC. In this scenario, the second device 116 may have a higher priority (domination) in selecting FEC than device 100, since device 100 tries to match the FEC of device 116. In other cases, device 100 may "force" a FEC algorithm by asserting its priority, in which case device 116 cycles through FEC algorithms to find a match.

If the negotiation module 114 receives the FEC AN response from the network-connected device 116 with a suggested FEC algorithm, the negotiation module 114 may select the suggested FEC algorithm. This FEC algorithm suggested in the AN response may be used for the messages received from the network-connected device 116, transmitted to the network-connected device, or both received and transmitted.

Alternatively, FEC algorithm negotiations may be conducted for the transmit and receive links. For example, the negotiation module 114 may send the FEC AN request with a suggested FEC algorithm for the messages received from the network-connected device 116, and a suggested FEC algorithm from messages transmitted to the network-connected device. These FEC algorithms suggested for the transmit and receive links may be different or the same. Further, the AN response may include an agreement to none, one, or both of the FEC suggestions. The AN request may also include counter-suggestions.

Figure 4:
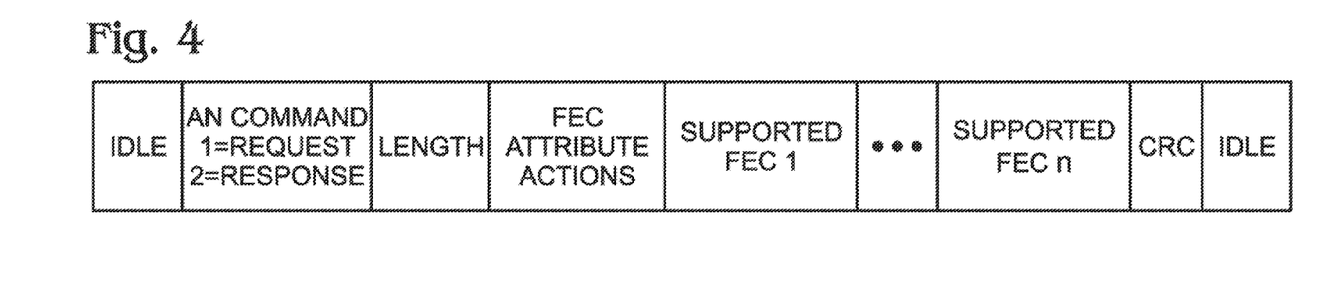
FIG. 4 is a diagram of an exemplary FEC AN message.

In one aspect, the negotiation module 114 sends an FEC AN request message including a list of the n FEC algorithms, and an order of FEC algorithm preference, see FIG. 4. The network interface 104 sends the AN request message to the network-connected device 116 via an in-band message on line 117 including overhead and payload sections, with the FEC AN request embedded in the overhead section. Alternatively, the AN request (and AN response) can be transmitted and received in out-of-band messages via network 120. Network 120 may be a different OTN network than OTN network 117, or it may use a different type of communication protocol (e.g., Ethernet).

In one aspect, prior to sending the FEC AN request message, the negotiation module 114 receives an FEC negotiation trigger, which may be a link state change, a change in the number of FEC-correctable errors received in messages from the network-connected device, or a system configuration change. The negotiation module 114 sends the FEC AN request message in response to the FEC negotiation trigger.

In another aspect, the statistics module 118 measures error statistics associated with the n FEC algorithms by using a first FEC algorithm to correct errors in messages received from the network-connected device 116. The statistics module 118 counts the number of uncorrected errors, and iteratively cycles through the n FEC algorithms, counting uncorrected errors. Alternatively, the statistics module 118 may measure uncorrectable FEC bit or block errors, corrected FEC bits or blocks, the FEC bit error rate (whether corrected or not), or an FEC signal failure, to name a few possible error measurement techniques.

Functional Description

To increase reliability, transmitted information is validated using one or more of the following methods. The FEC-encoded communications may contain an optional cyclic redundancy check (CRC) or checksum field when appropriate. The FEC-encoded communications may be transmitted and received multiple times and the received communications may be compared from the first byte to the last byte, to ensure the validity of the received message. A set of configuration threshold values may be used to determine the criteria on which the communications are considered validated or invalidated. For example, if the received communications are validated 9 out of 10 times, the communications may be considered valid.

To increase flexibility, the AN message data may include information concerning the capability and priority of the FEC algorithms available for the equipment. For example, the AN data may include the FEC types supported by the OTN equipment, including ITU standard FEC types or proprietary types. The AN data may include FEC type precedence. The transmitted AN data may also include the information about negotiated results, such as agreed upon FEC types, the use of no FEC at all, or the failure of agreement.

To support automation, the local equipment may begin to use a FEC type indicated in the FEC capability information of the FEC AN data. It may cycle the FEC type from the one with the highest precedence to the one with the lowest precedence, if there is no agreement or match reached in between. The local equipment may use FEC error indications or other performance monitoring techniques to determine if a FEC match is available. The local equipment may use FEC AN information received from remote equipment to determine the matching FEC. The local and remote equipment may suggest to each other an optimal FEC type based on the FEC error or other statistics.

Figure 2A:
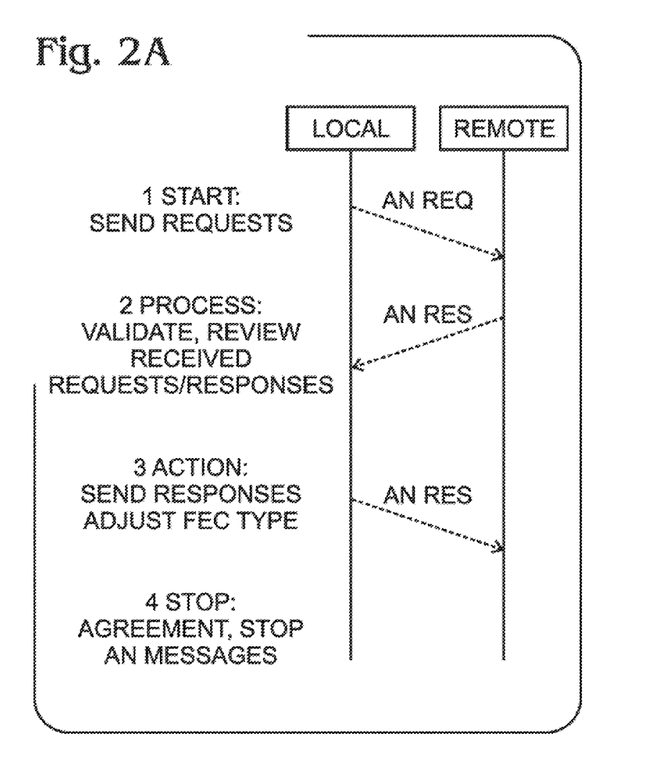
FIGS. 2A and 2B are diagrams depicting four AN procedure stages.

FIGS. 2A and 2B are diagrams depicting four AN procedure stages. In FIG. 2A, both a local and a remote device participate in a FEC AN process. In the AN start state (Step 1), a local device sends an AN request to a remote device. In the AN process state (Step 2), the remote device sends an AN response. In the AN action state (Step 3), the local device sends an acknowledgement and adjusts the FEC algorithm being used. In the AN stop state (Step 4), agreement has been received and no further AN messages are transceived.

Figure 2B:
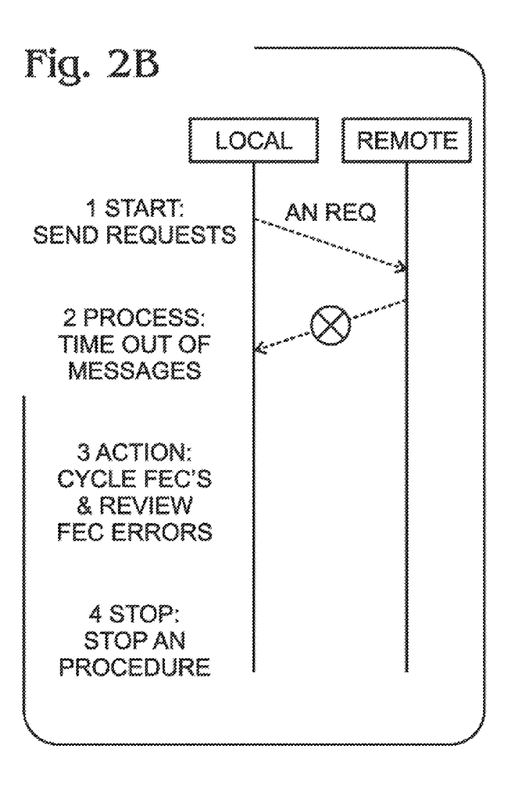

In FIG. 2B, the remote OTN device does not participate in an FEC AN process. In the AN start state (Step 1), a local device sends an AN request to a remote device. In the AN process state (Step 2), the local device times out because the remote device does not send an AN response. In the AN action state (Step 3), the local device cycles through the possible FEC algorithms and measures the errors. In the AN stop state (Step 4), an FEC algorithm has been either selected or not, and no further AN messages are transceived.

As an example implementation of AN states, an OTN equipment is normally in AN stop (idle) state. The OTN equipment can enter the AN start state at any time from the stop state. The AN start state is typically triggered by some link state changes, FEC error changes, or system configuration changes.

OTN equipment can enter the process state from the stop state if AN request messages are received, or if AN response messages are received. The process state can also be entered from the stop state if time out occurs, as a result of no AN messages being received from the remote equipment. OTN equipment can enter the action state from the process state only. OTN equipment can enter stop state, once it exits the action state.

Figure 3:
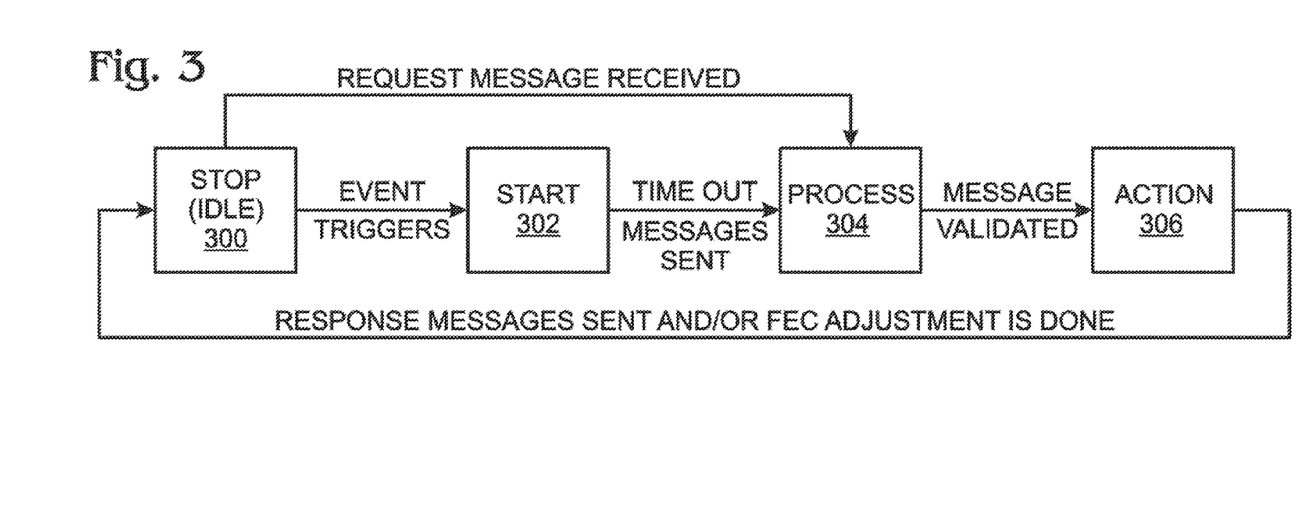
FIG. 3 is a state diagram illustrating the process flow of FIGS. 2A and 2B from a different perspective.

FIG. 3 is a state diagram illustrating the process flow of FIGS. 2A and 2B from a different perspective. The stop state 300 is an idle state in which no FEC AN occurs. In the start state 302 the equipment sends AN request messages for a predetermined amount of time. In the process state 304 the equipment receives and validates AN response messages or it times out in waiting for responses as the AN originator. In the action state 306 the equipment sends response messages and/or makes FEC type adjustments.

FIG. 4 is a diagram of an exemplary FEC AN message. As shown, the AN message may be comprised of multiple consecutive bytes in a single message, or as a small field in a series of consecutive messages. For example, the AN message is sent using 1-byte in any available overhead field or management frame field in OTN frames, such as the TCM field. Each of the fields in the message can be transmitted in the byte location, one byte at a time in multiple frames, i.e. the entire AN message is available through multiple OTN frames.

The idle field may be a special byte, e.g., 0xAB. The length field indicates the number of bytes in the message. Each of the message fields may use 4 least significant bits (LSBs) as the value and the 4 most significant bits (MSBs) as a 4-bit CRC for the field. For example, the AN Command field uses the first 4 LSBs, for command value (1 for request or 2 for response), and uses 4 MSBs as the 4-bit CRC for the first LSB value. Invalid messages are ignored. If no valid messages are received, a time-out scenario takes place.

The FEC AN request message contains FEC capability and precedence information. For example, FEC 1 may have the highest priority and FEC n the lowest. Likewise, the FEC AN response message may include a selected FEC or the FEC capability/precedence of the responder.

Figure 5:
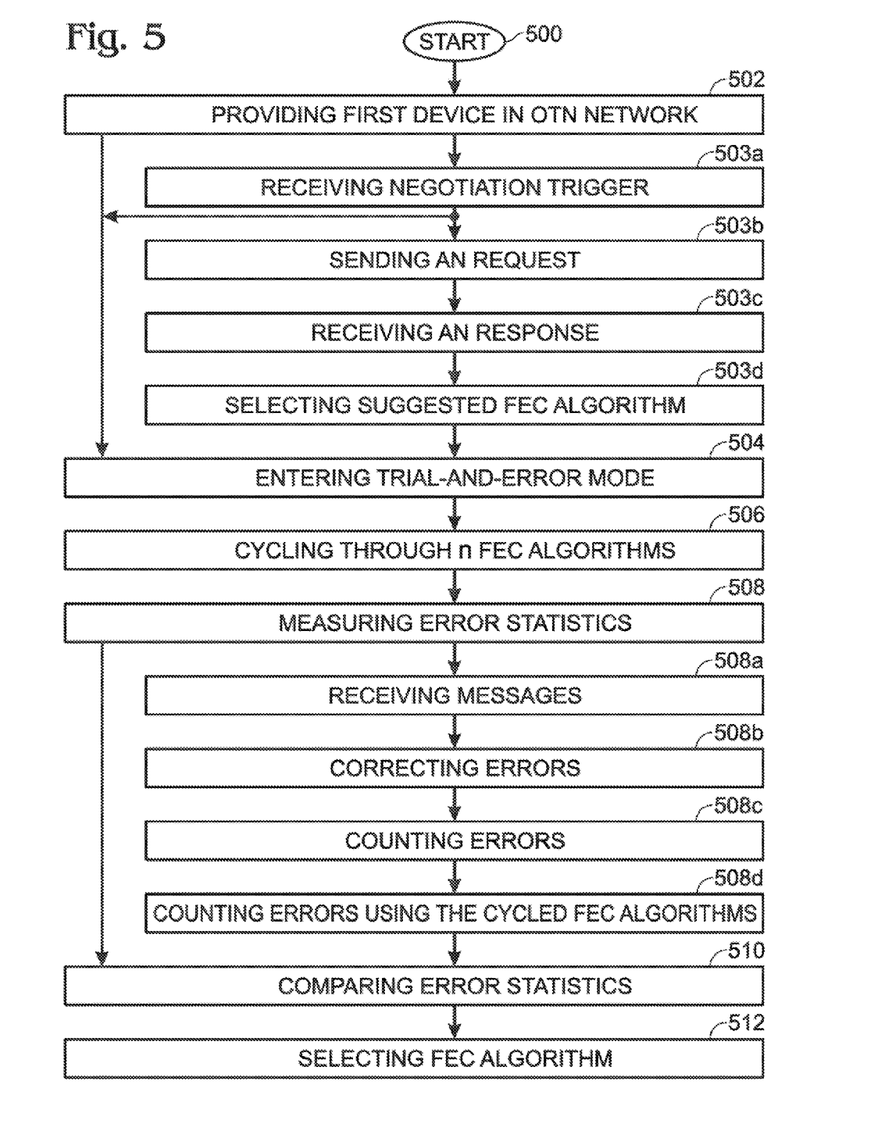
FIG. 5 is a flowchart illustrating a method a method for auto negotiating an FEC algorithm between network-connected devices in an OTN communication device using a plurality of FEC algorithms.

FIG. 5 is a flowchart illustrating a method a method for auto negotiating an FEC algorithm between network-connected devices in an OTN communication device using a plurality of FEC algorithms. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the steps are performed in numerical order. The method starts at Step 500.

Step 502 provides a first communication device. The first device is network-connected to a second device, and is capable of enabling a plurality of n FEC algorithms. In the event that the first device is unable to negotiate a mutually agreed upon FEC algorithm with the second device, in Step 504 the first device enters a trial-and-error mode, beginning with a first FEC algorithm. In Step 506 the first device iteratively cycles through each of the plurality of n FEC algorithms. Step 508 measures error statistics associated with the nth FEC algorithms, and Step 510 compares n sets of error statistics. In Step 512 the first device selects an FEC algorithm associated with the minimum number of errors.

In one aspect, selecting the FEC algorithm in Step 512 includes selecting the FEC algorithm to receive messages from the second device, with non-predetermined data and FEC sections encoded using the first FEC algorithm. In another aspect, Step 512 selects an FEC algorithm for transmitting messages to the second device with non-predetermined data and FEC sections encoded using the selected FEC algorithm. The FEC algorithm selected for transmissions may be the same one selected for received messages, or it may be a default FEC algorithm.

Prior to the first device entering the trial-and-error mode in Step 504, the first device sends an FEC auto negotiation (AN) request message to the second device in Step 503b. Then, the first device enters the trial-and-error mode in Step 504 as a result of the first device failing to receive an FEC AN response from the second device, or the second device not agreeing to the use of an FEC algorithm suggested by the first device. Sending the FEC AN request message in Step 503b may include the first device sending the FEC AN request message with a time-out field. Then, failing to receive the FEC AN response from the second device in Step 504 includes the first device failing to receive an FEC AN response within a period of time specified in the time-out field.

In Step 503c the first device receives the FEC AN response from the second device, with the response including a suggested FEC algorithm. In Step 503d the first device selects the FEC algorithm suggested in the FEC AN response. In one variation, the FEC AN response of Step 503c includes a suggested FEC algorithm for the messages received by the first device from the second device, or a suggested FEC algorithm from messages transmitted by the first device to the second device. The FEC algorithms used for receiving and transmitting messages may, or may not be the same.

Likewise, the FEC AN request sent in Step 503b may include a suggested FEC algorithm for the messages received by the first device from the second device, and/or a suggested FEC algorithm from messages transmitted by the first device to the second device. Again, the FEC algorithms used for receiving and transmitting messages may, or may not be the same. As shown in FIG. 4, the FEC AN request message may include a list of the n FEC algorithms and an order of FEC algorithm preference. The FEC AN request sent in Step 503b may be sent as an in-band message including overhead and payload sections, with the FEC AN request embedded in the overhead section, or as an out-of-band communication.

In one aspect, prior to the first device sending the FEC AN request message in Step 503b, the first device receives an FEC negotiation trigger in Step 503a. The trigger may be a link state change, a change in the number of FEC-correctable errors received in messages from the second device, or a system configuration change. Then, the first device sends the FEC AN request message in Step 503b in response to the FEC negotiation trigger.

In another aspect, the first device measures error statistics associated with the n FEC algorithms in Step 508 as a series of substeps. In Step 508a the first device receives messages from the second device. Step 508b uses the first FEC algorithm to correct errors in the received messages. Step 508c counts the number of uncorrected errors. Step 508d counts the number of uncorrected errors using the iteratively cycled FEC algorithms. As noted above, error statistics can be measured by means other than counting uncorrected errors, and the method is not limited to any particular error measurement means.

A system and method for negotiating a FEC algorithm have been provided. Examples, of particular circuitry and process flows have been given to illustrate the invention. However, the invention is not limited to merely these examples. Likewise, examples have been given in the context of an OTN network. Again the invention is not limited to these examples. Other variations and embodiments of the invention will occur to those skilled in the art.

I claim:

1. A method for data transmission, the method comprising:
sending a Forward Error Correction (FEC) automatic negotiation (AN) request message from a first device to a second device to determine a negotiated FEC process for data transmission between the first and the second device, wherein the negotiated FEC process comprises an FEC process that is agreed upon by both the first and the second device;

upon determination of the negotiated FEC process, transmitting data between the first device and the second device using the negotiated FEC process;

in response to a failure to determine the negotiated FEC process, performing operations of:

transmitting a first plurality of sets of data between the first device and the second device, wherein each set of the first plurality of sets of data is transmitted using a different FEC process selected from a plurality of FEC processes, and wherein instructions for executing the plurality of FEC algorithms are preloaded in the first device;

determining a data transmission error rate associated with transmitting each set of the first plurality of sets of data using a corresponding FEC process between the first deice and the second device; and subsequent to transmitting the first plurality of sets of data, determining preferred FEC process associated with a minimum data transmission error rate from transmitting the first plurality of sets of data; and transmitting a second plurality of sets of data between the first device and the second device using the preferred FEC process.

2. The method of claim 1, wherein the first plurality of sets of data is a plurality of test messages.

3. The method of claim 2, wherein the negotiated FEC process is a default FEC process.

4. The method of claim 1, wherein the FEC AN request message identifies a suggested FEC process, and wherein the failure to determine a negotiated FEC process comprises failure of the first device to receive a response from the second device in response to FEC AN request message, or a failure of the second device to agree to use the suggested FEC process for data transmission between the first and the second device.

5. The method of claim 4 wherein the FEC AN request message further comprises a predetermined time that specifies a response time limit of the second device.

6. The method of claim 1 further comprising:

receiving an FEC negotiation response message from the second device, wherein the FEC negotiation response message comprises a first suggested FEC process;

determining the first suggested FEC process as the negotiated process.

7. The method of claim 6 wherein the FEC negotiation response message further comprises a second suggested FEC process; and the method further comprising:

determining the second suggested FEC process as the negotiated processes; and sending data from the second device to the first device using the second suggested FEC process.

8. The method of claim 1 wherein the FEC AN request message comprises: a first suggested FEC process for sending data from the first device to the second device, and a second suggested FEC process for sending data from the second device to the first device.

9. The method of claim 1 wherein the FEC AN request message identifies the plurality of the FEC processes and an order of preference thereof.

10. The method of claim 1 wherein the FEC AN request message is an in-band message that comprises an overhead section, a payload section and a FEC AN request section, or an out-of-band communication.

11. The method of claim 1 wherein sending an FEC AN request message comprises sending an FEC AN request message in response to a FEC negotiation trigger, wherein the FEC negotiation trigger is an event selected from a group consisting of a link state change, a change in a number of FEC-correctable errors received in messages from the second device, and a transmitting device configuration change.

12. The method of claim 1 wherein determining a data transmission error rate associated with transmitting each set of the first plurality of sets of data comprises:

receiving messages from the second device;

using a first FEC process to correct errors in messages sent from the second device;

counting a number of uncorrected errors; and, counting the number of uncorrected errors using the plurality of FEC processes.

13. A transmitter comprising:

a network interface;

a processor a local tangible memory;

a coding bank comprising a plurality of FEC processes that are executable by the processor, a negotiation module, enabled as a sequence of software instructions stored in the memory and executable by the processor, and operable to iteratively cycle through the plurality of FEC process modules in the coding bank in response to determination that the transmitter is unable to determine a negotiated FEC process that both the transmitter and device receiver agree to use for data transmission, wherein the receiver is coupled with the device through network;

a statistics module that is enabled as a sequence of software instructions stored in the memory and executable by the processor, and operable to determine data transmission errors associated with data transmission using each of the plurality of FEC processes;

wherein the negotiation module is further operable to determine preferred FEC process for subsequent data transmission between the transmitter and the receiver, the preferred FEC process being associated with a minimum number of data transmission errors.

14. The transmitter of claim 13 wherein the negotiation module is operable to determine a negotiated FEC process to transmit messages between the transmitter and the receiver, wherein the messages comprise non-predetermined data and FEC sections encoded using a first FEC process of the plurality of FEC processes.

15. The transmitter of claim 14 wherein the negotiated FEC process is chosen from the group consisting of an FEC process selected for received messages and a default FEC process.

16. The transmitter of claim 14 wherein the negotiation module is further operable to receive the FEC AN response from the receiver with a suggested FEC process, and operable to select the suggested FEC process as the negotiated FEC process.

17. The transmitter of claim 16 wherein the suggested FEC process is an FEC process used for the messages received from the receiver, and/or a suggested FEC process used for messages transmitted to the receiver.

18. The transmitter of claim 13 wherein the negotiation module is further operable to:

send a Forward Error Correction (FEC) automatic negotiation (AN) request message to the receiver to determine a negotiated FEC process for data transmission between the transmitter and the receiver, wherein the negotiated FEC process is an FEC process that is agreed upon by both the transmitter and the receiver; and in response to a failure to determine a negotiated FEC process, transmit a first plurality of sets of data between the first device and the second device using a plurality of FEC processes, wherein further each set of the first plurality of sets of data is transmitted using a different FEC process selected from the plurality of FEC algorithms.

19. The transmitter of claim 18 wherein the negotiation module is further operable to generate an FEC AN request message that comprises a time-out field, and wherein the failure to determine the negotiated FEC process comprises a failure to receive an FEC AN response from the receiver within a period of time specified in the time-out field.

20. The transmitter of claim 18 wherein the FEC AN request identifies a first suggested FEC process for transmitting data from the receiver to the transmitter, and a second suggested FEC process for transmitting data from the transmitter to the receiver.

21. The transmitter of claim 18 wherein the negotiation module is further operable to send the FEC AN request message that identifies the plurality of FEC processes and an order of FEC process preference.

22. The transmitter of claim 18 wherein the network interface sends the AN request message to the receiver using a message selected from a group consisting of an in-band message including overhead and payload sections, with the FEC AN request embedded in the overhead section, and an out-of-band message.

23. The transmitter of claim 18 wherein the negotiation module, prior to sending the FEC AN request message, is operable to receive an FEC negotiation trigger event selected from a group consisting of a link state change, a change in a number of FEC-correctable errors, and a system configuration change, and operable to send the FEC AN request message in response to the FEC negotiation trigger event.

24. The transmitter of claim 13 wherein the statistics module is operable to determine data transmission errors by using a first FEC process to correct errors in messages received from the receiver, counting the number of uncorrected errors, iteratively cycling through the plurality of FEC process, and counting uncorrected errors.

* * * * *